US009279851B2

(12) United States Patent
Csaszar (10) Patent No.: US 9,279,851 B2
(45) Date of Patent: Mar. 8, 2016

(54) STRUCTURES AND METHODS FOR TESTING INTEGRATED CIRCUITS AND VIA CHAINS THEREIN (71) Applicant: GLOBALFOUNDRIES, Inc., Grand Cayman (KY)

(72) Inventor: Farkas Marton Csaszar, Radebeul (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 488 days.

(21) Appl. No.: 13/875,962

(22) Filed: May 2, 2013

(65) Prior Publication Data
US 2014/0327465 A1 Nov. 6, 2014

(51) Int. Cl.
G01R 31/02 (2006.01)
G01R 31/28 (2006.01)
H01L 21/66 (2006.01)

(52) U.S. Cl.
CPC ............ G01R 31/2853 (2013.01); H01L 22/34 (2013.01)

(58) Field of Classification Search
CPC ........... G01R 31/2884; G01R 31/2853; G01R 31/2877; G01R 31/2856; G01R 31/32; G01R 31/317; G01R 31/31924; G01R 31/3004; G01R 31/3008; G01R 31/31922; G01R 31/2831; G01R 31/318505
USPC .................... 324/762.01–762.03, 762.1, 766, 324/750.24, 765, 750.11; 257/E23.001, 257/E21.001, 48, 211, 529, 536, E21.522, 257/E23.179, E21, 521; 438/5, 11, 14, 17, 438/18, 8, 48, 667, 672
See application file for complete search history.

(56) References Cited

U.S. PATENT DOCUMENTS 5,900,735 A * 5/1999 Yamamoto ......... G01R 31/2853
257/758
6,570,181 B1 * 5/2003 Graas ...................... H01L 22/34
257/48

(Continued)

FOREIGN PATENT DOCUMENTS

CN       101438177 A    5/2009
JP     2007322127 A   12/2007

OTHER PUBLICATIONS

Taiwan Intellectual Property Office, Examination Report for Taiwanese Patent Application No. 102142936 mailed Oct. 28, 2014.

(Continued)

*Primary Examiner* — Tung X Nguyen
*Assistant Examiner* — Thang Le
(74) *Attorney, Agent, or Firm* — Ingrassia Fisher & Lorenz, P.C.

(57) ABSTRACT

An exemplary structure for testing an integrated circuit includes a semiconductor substrate and first and second via chains disposed over the substrate. The via chains include a substantially same sequence of segments interconnected at N via regions by a respective first and second via arrangement. The first via arrangement includes $M_N$ first vias at each respective via region and the second via arrangement includes $M_N+K_N$ second vias at each respective via region. The first via arrangement is different than the second via arrangement and $K_N \geq 1$ for at least one via region. The structure includes a voltage sensing apparatus in electrical connection with each via chain and configured to drive a first constant current through the first via chain and to drive a second constant current through the second via chain to measure a differential voltage between the via chains.

20 Claims, 3 Drawing Sheets (56) References Cited

U.S. PATENT DOCUMENTS

| | | | | |
|---|---|---|---|---|
| 7,919,973 | B2* | 4/2011 | Yach | G01R 31/31717 324/750.3 |
| 2004/0262604 | A1* | 12/2004 | Lee | H01L 22/34 257/48 |
| 2005/0199875 | A1* | 9/2005 | Umemura | H01L 22/34 257/48 |
| 2006/0220012 | A1* | 10/2006 | Wu | H01L 22/34 257/48 |
| 2007/0111342 | A1* | 5/2007 | Satya | H01L 22/34 438/17 |
| 2007/0296439 | A1* | 12/2007 | Feustel | H01L 22/34 324/754.03 |
| 2009/0121730 | A1 | 5/2009 | Kimura et al. | |
| 2011/0221460 | A1* | 9/2011 | Trebo | G01R 31/2884 324/750.3 |
| 2013/0038334 | A1* | 2/2013 | Brochu, Jr. | G01R 31/2858 324/537 |

OTHER PUBLICATIONS

The Intellectual Property Office, Decision Letter for Taiwanese Patent Application No. 102142936 dated Aug. 28, 2015.

* cited by examiner

STRUCTURES AND METHODS FOR TESTING INTEGRATED CIRCUITS AND VIA CHAINS THEREIN

TECHNICAL FIELD

The technical field generally relates to structures and methods for testing integrated circuits, and more particularly relates to structures and methods for testing via chains in integrated circuits with improved accuracy in via resistance measurements.

BACKGROUND

Integrated circuits comprise a large number of individual circuit elements, such as transistors, capacitors and resistors. These elements are connected by means of electrically conductive features to form complex circuits, such as memory devices, logic devices, and microprocessors. Multiple conductive layers are formed over individual circuit elements in and on a semiconductor substrate and are typically separated from each other by insulating dielectric layers. The conductive layers are often selectively connected or "wired" together in order to allow for conduction of electricity in a desired pattern. One means of connecting conductive layers is through the formation of a via at an interconnection between conductive layers. Vias are channels or plugs of conductive material. Interconnections between multiple conductive layers may be formed by a series of vias, i.e., a via chain.

During the formation of a via, problems may arise from high contact resistance between the via material and the region of the conductive layer to which it contacts, or through void or seam formation within the via. However, integrated circuit performance requires that the vias have substantially uniform resistances.

Therefore, it is desirable to measure the resistances of vias to ensure proper integrated circuit performance. However, along with the miniaturization of device features of modern, ultra-high density integrated circuits, vias have decreased in size such that measurement of via resistance is difficult. Specifically, typical testing tools struggle to measure accurately in the microvolt ($\mu V$) differential voltage range. Further, noise and offset levels are substantial in the $\mu V$ range. At the same time, current cannot be raised to overcome the testing limitations as the vias under testing generally cannot carry high currents. Specifically, high current densities lead to overheating and destruction of the vias. As a result, it is difficult to measure the resistance of vias that have low resistance and low current carrying capacity.

Accordingly, it is desirable to provide improved structures and methods for testing integrated circuits and via chains therein. Further, it is desirable to provide structures and methods for measuring resistances of via chains in integrated circuits. Furthermore, other desirable features and characteristics will become apparent from the subsequent detailed description and the appended claims, taken in conjunction with the accompanying drawings and the foregoing technical field and background.

BRIEF SUMMARY

Structures and methods for testing integrated circuits and via chains are provided. In an embodiment, a structure for testing an integrated circuit includes a semiconductor substrate and first and second via chains disposed over the substrate. The via chains include a substantially same sequence of segments interconnected at N via regions by a respective first and second via arrangement. The first via arrangement includes $M_N$ first vias at each respective via region and the second via arrangement includes $M_N+K_N$ second vias at each respective via region. The first via arrangement is different than the second via arrangement and $K_N \geq 1$ for at least one via region. The structure includes a voltage sensing apparatus in electrical connection with each via chain and configured to drive a first constant current through the first via chain and to drive a second constant current through the second via chain to measure a differential voltage between the via chains.

In accordance with another embodiment, a structure is provided for testing a via chain. The structure includes a first via chain having N via regions, wherein each via region includes $M_N$ vias. The structure further includes a second via chain having N via regions, wherein each via region includes $M_N+K_N$ vias. In the structure, $K_N \geq 2$ for at least two via regions when $M_N=1$; $K_N \geq 1$ for at least three via regions when $M_N=1$; or $K_N \geq 1$ for at least seven via regions when $M_N=2$. Also, the structure includes a voltage sensing apparatus in electrical connection with each via chain and configured to drive a first constant current through the first via chain and to drive a second constant current through the second via chain to measure a differential voltage between the first via chain and the second via chain.

In another embodiment, a method for testing an integrated circuit is provided. The method includes providing a semiconductor substrate disposed with a first via chain and a second via chain. The first via chain includes a first sequence of segments interconnected at N via regions by a first via arrangement, wherein the first via arrangement includes a selected number of first vias at each respective via region in the first via chain. The second via chain includes a second sequence of segments interconnected at N via regions by a second via arrangement different from the first via arrangement, wherein the second via arrangement includes a selected number of second vias at each respective via region in the second via chain. Further, the second sequence of segments is substantially the same as the first sequence of segments. The method includes driving a first constant current through the first via chain and driving a second constant current equal to the first constant current through the second via chain. The method further includes calculating a resistance of the vias in the first via chain.

BRIEF DESCRIPTION OF THE DRAWINGS

Embodiments of structures for testing integrated circuits and via chains, and embodiments of methods for testing integrated circuits and via chains using such structures will be described in conjunction with the following drawing figures, wherein like numerals denote like elements, and wherein.

DETAILED DESCRIPTION

The following detailed description is merely exemplary in nature and is not intended to limit the structures and methods for testing integrated circuits or via chains claimed herein. Furthermore, there is no intention to be bound by any expressed or implied theory presented in the preceding technical field, background or brief summary, or in the following detailed description.

Structures and methods for testing integrated circuits and via chains as described herein avoid issues faced by current testing apparatuses. For example, current testing techniques often cannot measure accurately in the μV differential voltage range. To provide for improved testing and measurement, the structures and methods herein test via chains rather than individual vias. A via chain includes a sequence of conductive segments, e.g., metal layers, interconnected by via regions. Because voltage differential is higher across via chains than across individual vias, it is more easily and accurately measured for via chains.

Further, the structures and methods herein avoid measurement problems typically encountered when measuring voltage differential across via chains. Specifically, parasitic resistance is typically a problem when measuring differential voltage across a path including conductive segments. Herein, problems associated with the measurement of parasitic resistance are avoided by testing two via chains having substantially same conductive segment sequences. Comparison of a differential voltage across the two via chains allows for cancellation of parasitic resistance.

According to the embodiments herein, while the conductive segment sequences in the via chains are substantially the same, the interconnecting via regions are provided with different numbers of vias. Specifically, for at least one via region, the first via chain has a selected number of fewer vias than the second via chain. A difference in voltage differential across the first via chain and the second via chain is solely attributable to the difference in the number of vias. Therefore, the resistance of the vias may be calculated from the difference in voltage differentials across the via chains.

Figure 1:
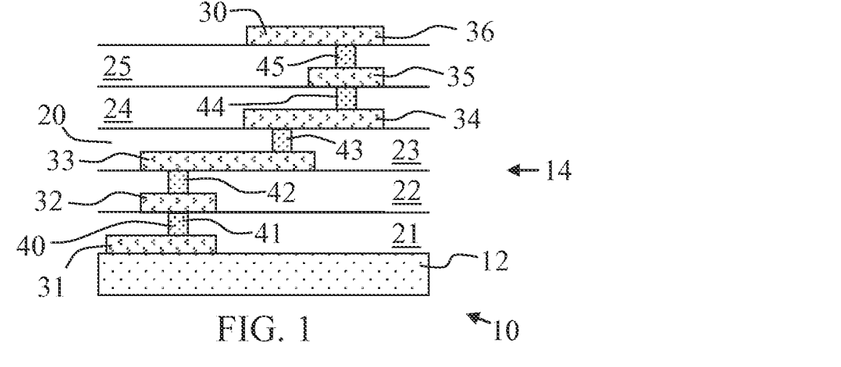
FIG. 1 is a cross sectional view of a via chain formed over a semiconductor substrate in accordance with an exemplary embodiment.

FIG. 1 illustrates an exemplary integrated circuit 10 including semiconductor devices (not shown) formed in and/or on a semiconductor substrate 12 and a via chain 14 formed over the semiconductor substrate 12. As shown, dielectric layers 20, such as layers 21, 22, 23, 24 and 25, are formed over the semiconductor substrate 12. Further, conductive layer segments 30, such as metal segments, are formed over the semiconductor substrate 12 and over each dielectric layer 20 to form an interconnect structure. As shown, segment 31 is formed over the semiconductor substrate 12, segment 32 is formed over dielectric layer 21, segment 33 is formed over dielectric layer 22, segment 34 is formed over dielectric layer 23, segment 35 is formed over dielectric layer 24, and segment 36 is formed over dielectric layer 25. The conductive layer segments 30 are electrically interconnected by via regions 40. Specifically, via region 41 electrically connects segments 31 and 32, via region 42 electrically connects segments 32 and 33, via region 43 electrically connects segments 33 and 34, via region 44 electrically connects segments 34 and 35, and via region 45 electrically connects segments 35 and 36. The path from segment 31 to segment 36 is defined as via chain 14. Via chains 14 may be formed in the device area of the integrated circuit 10 and in a testing area of the integrated circuit 10.

Figure 2:
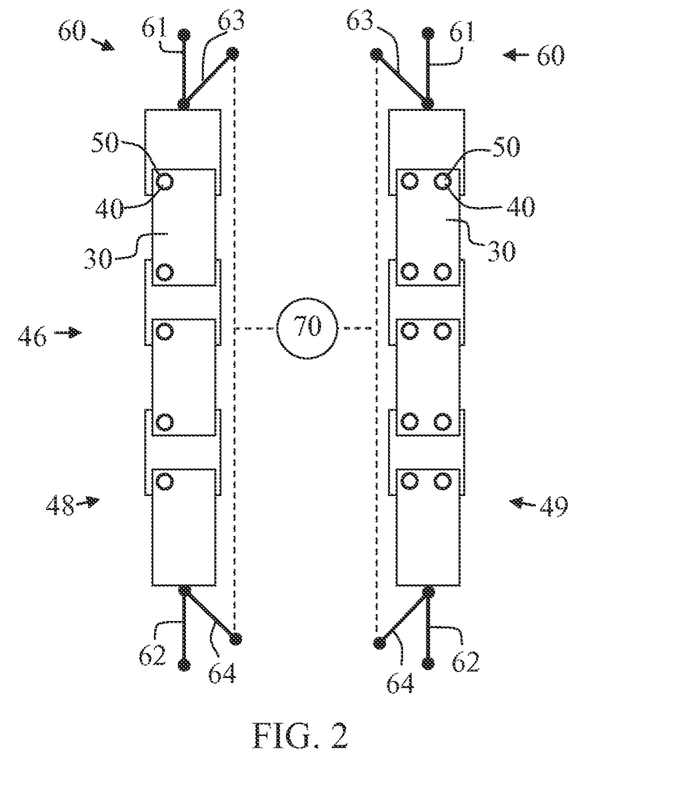
FIG. 2 is a schematic layout view of a structure for testing an integrated circuit utilizing a first via chain and a second via chain in accordance with an exemplary embodiment.

FIG. 2 illustrates a testing structure 46. As shown, the testing structure 46 includes two via chains 48 and 49 having substantially the same sequences of conductive layer segments 30 and via regions 40. Physical layouts of the conductive layer segments 30 in the two via chains 48 and 49 are matched to have equivalent resistances. For example, the two via chains 48 and 49 may have equivalent layouts on metal levels forming the conductive layer segments 30, and subsections of via chains 48 and 49 alternate in the metal levels to enhance matching of manufactured characteristics. As used herein, via chains 48 and 49 having the same number of conductive layer segments 30 formed from substantially the same conductive material and the same number of via regions 40 have substantially the same sequences. As shown, each via region 40 in via chain 48 includes one via 50. Further, each via region 40 in via chain 49 includes two vias 50.

Testing structure 46 includes a voltage sensing apparatus 60 connected to each via chain 48 and 49. The exemplary voltage sensing apparatus 60 of FIG. 2 is a four-terminal or Kelvin sensing apparatus. Specifically, each exemplary voltage sensing apparatus 60 includes a first force connection 61 and a second force connection 62. Further, each voltage sensing apparatus 60 is configured to drive a same constant current through each via chain 48 and 49 from first force connection 61 to second force connection 62. Each voltage sensing apparatus 60 further includes a first sense connection 63 and a second sense connection 64. Each sense connection 63 measures an applied voltage before the via chain 48 or 49, and each sense connection 64 measures an applied voltage after the via chain 48 or 49.

The exemplary testing structure 46 further includes a controller 70 in communication with the sense connections 63 and 64. The controller 70 may subtract the voltage measurement at each second sense connection 64 from the voltage measurement at each respective first sense connection 63 to find a respective voltage differential for each via chain 48 and 49. Further, the controller 70 may calculate the resistance of the via chain 48 by comparing the voltage differentials of the via chains 48 and 49 as discussed below.

While the via chain 48 includes a single via 50 at each via region 40 and the via chain 49 includes two vias 50 at each via region 40, the testing structure 46 need not be limited to such an embodiment. Rather, it is contemplated that the via chains 48 and 49 differ in number of vias 50 at at least one via region 40, such as at two via regions 40. Further, the number of vias 50 at selected via regions 40 need not be one or two, or differ by only one, but can be any practical number. An exemplary first via chain includes $M_N$ number of parallel vias at each N via region in the first via chain, where $M_N \geq 1$. An exemplary second via chain includes $M_N + K_N$ parallel vias at each N via region in the second via chain, where $K_N \geq 1$ for at least one via region. At other via regions, $K_N$ may equal 0.

Calculation of via resistance may be understood from discussion of a simplified testing structure that includes two via chains (or via chain sections) including conductive layer segments, such as alternating layers of metal A and metal B, interconnected by conductive vias to provide total of N number of transition or via regions between the conductive layer segments. While first via chains may include $M_N$ number of vias at each N via region in the first via chain, in a simplified testing structure $M_N = 1$ for each via region. While second via chains may include $M_N + K_N$ number of vias at each N via region in the second via chain, in a simplified testing structure $K_N = 1$ for each via region.

For the simplified testing structure (and wherein "sch" refers to a first via chain and "dch" refers to a second via chain):

$$V\_sch=(If\_sch)*(N*Rvia/M+Rasum+Rbsum)$$

$$R\_sch=V\_sch/If\_sch$$

$$R\_dch=V\_dch/If\_dch$$

$$R\_amp=Rsch-Rdch$$

$$Rvia=R\_amp/(N*((1/M_N)-1/(K_N+M_N))$$

where N is number of via regions 40 in each via chain;
Rasum is the sum of resistances of metal A sections;
Rbsum is the sum of resistances of metal B sections;
If_sch and If_dch are the forced currents through the respective via chains;
Pforce_high and Pforce_low are the force connections between which source power is applied;
Rvia is the single via resistance; and
R_amp is the calculated resistance difference between the first and the second chain.

Thus, the difference in resistances between the two via chains gives the resistance value equivalent of $N*((1/M_N)-1/K_N+M_N))$ vias. If $M_N=1$ and $K_N=1$ for all N via regions, this gives N/2 times the single via resistance. While the calculation becomes more complicated for testing structures having less simplified arrangement of vias, an equation for finding via resistance can be developed for any testing structure having two via chains with substantially same conductive segment sequences interconnected by varying, but known, arrangements of parallel vias. Improvement in calculating via resistance may be obtained when the first via chain includes a first via arrangement including $M_N$ first vias at each respective via region in the first via chain and the second via chain includes a second via arrangement different from the first via arrangement, such that the second via arrangement includes $M_N+K_N$ second vias at each via region in the second via chain, wherein $K_N \geq 1$ for at least one via region. In practice, improvement in resistance calculation has been found when $K_N \geq 2$ for at least two via regions when $M_N=1$ (assuming $K_N=0$ for all other via regions) or when $K_N \geq 1$ for at least three via regions when $M_N=1$ (assuming $K_N=0$ for all other via regions). Substantial improvement in resistance calculation has been found when $K_N \geq 1$ for at least seven via regions when $M_N=2$ (assuming $K_N=0$ for all other via regions). The arrangement of via regions and vias may be selected upon simplicity, the desired calculation accuracy, or other factors.

Figure 3:
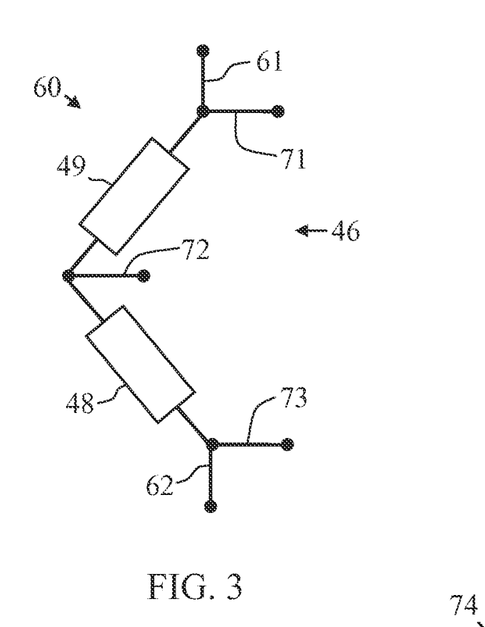
FIG. 3 is a schematic layout view of an alternate embodiment of a structure for testing an integrated circuit.

Referring now to FIG. 3, an alternate embodiment of the testing structure 46 is illustrated. In FIG. 3, via chains 48 and 49 are connected in series and the voltage sensing apparatus 60 includes shared voltage and sense connections. Specifically, the first force connection 61 is connected to the via chain 49 and the second force connection 62 is connected to the via chain 48. As a result, the current from the first force connection 61 to second force connection 62 is driven through the via chains 49 and 48. Therefore, the current is the same across the via chains 48 and 49.

As shown, the voltage sensing apparatus 60 includes a first sense connection 71, a second sense connection 72, and a third sense connection 73. The first sense connection 71 measures an applied voltage before the via chain 49, the second sense connection 72 measures an applied voltage after the via chain 49 and before the via chain 48, and the third sense connection 73 measures an applied voltage after the via chain 48. Similar to FIG. 2, a controller (not shown) may be used to calculate via resistance from the measurements taken by the sense connections 71, 72 and 73.

Figure 4:
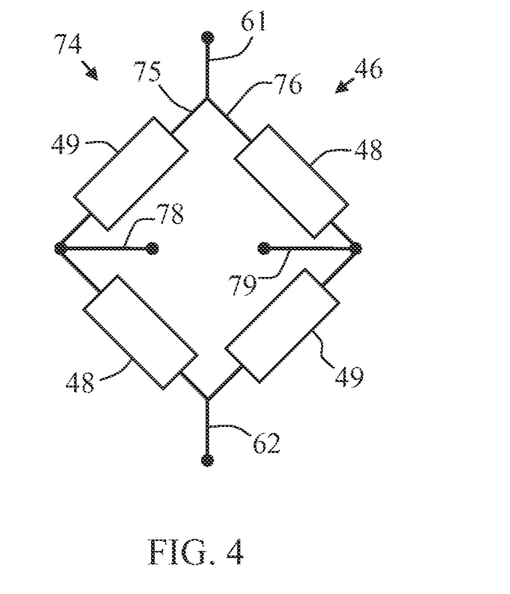
FIG. 4 is a schematic layout view of another alternate embodiment of a structure for testing an integrated circuit.

FIG. 4 illustrates another embodiment of the testing structure 46. In FIG. 4, the testing structure 46 uses an amplifier bridge structure 74 with a first series 75 of via chains 49 and 48 and a second parallel series 76 of via chains 48 and 49. As shown, the voltage sensing apparatus 60 includes shared voltage and sense connections. Specifically, the first force connection 61 and the second force connection 62 are connected to the parallel series 75 and 76 to drive a current equally through each series. The amplifier bridge structure 74 allows for the use of only two sense connections. Specifically, a first sense connection 78 measures an applied voltage after the via chain 49 in the first series 75 and a second sense connection 79 measures an applied voltage after the via chain 48 in the second series 76.

In the equations below, "sch" refers to via chain 48 in second series 76 and "dch" refers to via chain 49 in first series 75. Further, for the simplified exemplary structure 74 of FIG. 4, K=1 and M=1 for all via regions. For the amplifier bridge configuration of the testing structure 46 in FIG. 4:

$$Vmeas=V\_sch-V\_dch=(N/4)*If*Rvia=(N/4)*Vvia$$

$$Rvia=4*Vmeas/(N*If)=(Vmeas/If)/(N/4)$$

where:
N is the number of via regions;
M=1 and K=1 for all via regions;
Vmeas is the differential voltage between via chains;
V_sch is the resulting voltage after the via chain 48 (by forcing If current between second force connection 62 and first force connection 61); and
V_dch is the resulting voltage after the via chain 49 (by forcing If current between second force connection 62 and first force connection 61).

Use of the amplifier bridge structure allows resistance measurement with a simple pad layout and quick "Force current—Measure voltage" test sequence with a subsequent step of dividing by N/4. The subtractive construction within the bridge structure reduces error factors because only one measurement is taken (hence error is introduced only once), and any relative error of the measurement equipment is applied directly on the (Vsch−Vdch) differential voltage (unlike by subsequent subtraction calculation processes where relative errors apply to the magnitude of Vsch and the Vdch, both of which are larger than the final result (Vsch−Vdch)).

Figure 5:
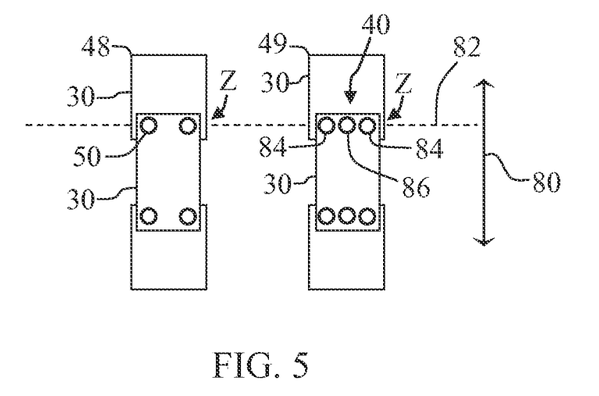
FIG. 5 is a schematic layout view illustrating the interconnection of conductive segments at a via region with a selected arrangement of vias in accordance with an embodiment herein.

FIG. 5 illustrates an exemplary interconnection of conductive layer segments 30 at a selected via region Z in via chains 48 and 49. At via region Z, $M_Z=2$ and $K_Z=1$. As shown, via chain 48 and via chain 49 each extend in a longitudinal direction 80. Further, the vias 50 in each via region 40 are arranged in a linear layout extending in a direction 82 substantially perpendicular to the longitudinal direction 80. A via region 40 including more than two vias 50 is considered to have outer vias 84. As shown, middle via(s) 86 is positioned between the outer vias 84. Differences in parasitic resistance in the conductive layer segments 30 between via chains 48 and 49 are avoided by using the linear arrangement of vias 50.

Figure 6:
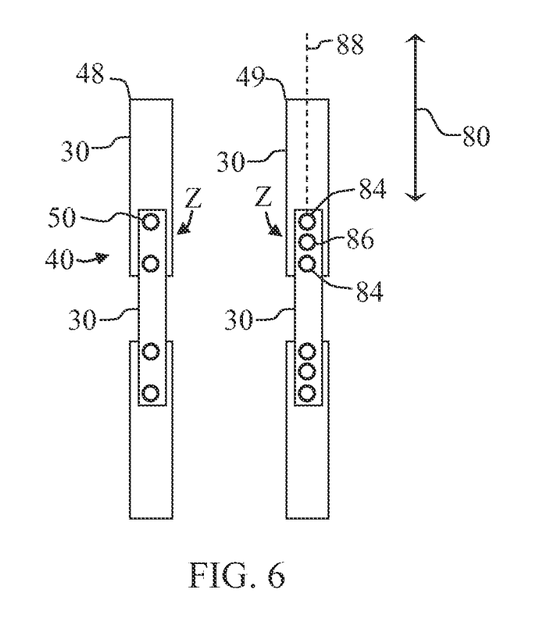
FIG. 6 is a schematic layout view illustrating the interconnection of conductive segments at a via region with an alternate arrangement of vias in accordance with another embodiment herein.

FIG. 6 illustrates another exemplary interconnection of conductive layer segments 30 at a selected via region Z in via chains 48 and 49. At via region Z, $M_Z=2$ and $K_Z=1$. As shown, via chain 48 and via chain 49 each extend in a longitudinal direction 80. Further, the vias 50 in each via region 40 are arranged in a linear layout extending in a direction 88 substantially parallel or coincident to the longitudinal direction 80. A via region 40 including more than two vias 50 is considered to have outer vias 84. As shown, middle via(s) 86 is positioned between the outer vias 84. Differences in parasitic resistance in the conductive layer segments 30 between via chains 48 and 49 are avoided by using the linear arrangement of vias 50.

To briefly summarize, the structures and methods for testing integrated circuits described herein utilize two via chains having substantially same sequences of conductive segments interconnected with via regions having different numbers of vias in at least one via region. The testing structures use four terminal resistance measurements to measure the resistances of the two via chains very accurately. The resistances of the via chains are provided with a higher sense measurement voltages (Vsense_high−Vsense_low) than those provided by testing a single via, and high differential voltage measurements enable accurate precision measurements using conventional measurement equipment. Further, by using the difference between the measured resistances (i.e., the difference between differential voltages), the parasitic content of the conductive segments are removed from the calculations. Also, due to the increased sense measurement voltages, the current densities per via can be lowered and high current density induced measurement reproducibility problems can be minimized. Due to measuring multiple vias in series, the inherent averaging also enhances statistical accuracy of the mean value measurement of the via resistance.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A structure for testing an integrated circuit comprising:
   a semiconductor substrate;
   a first via chain disposed over the semiconductor substrate, wherein the first via chain includes a first sequence of segments interconnected at N via regions by a first via arrangement, wherein the first via arrangement includes $M_N$ first vias at each respective via region in the first via chain;
   a second via chain disposed over the semiconductor substrate, wherein the second via chain includes a second sequence of segments interconnected at N via regions by a second via arrangement different from the first via arrangement, wherein the second via arrangement includes $M_N+K_N$ second vias at each via region in the second via chain, wherein $K_N \geq 1$ for at least one via region, and wherein the second sequence of segments is substantially the same as the first sequence of segments; and
   a voltage sensing apparatus in electrical connection with each via chain and configured to drive a first constant current through the first via chain and to drive a second constant current through the second via chain to measure a differential voltage between the via chains.

2. The structure of claim 1 further comprising a controller configured to calculate a resistance of the vias in the first via chain from differential voltage.

3. The integrated circuit testing structure of claim 1 wherein the voltage sensing apparatus comprises a first four-terminal sensing apparatus connected to the first via chain and configured to drive the first constant current through the first via chain to measure a first voltage drop across the first via chain and a second four-terminal sensing apparatus connected to the second via chain and configured to drive the second constant current through the second via chain and to measure a second voltage drop across the second via chain.

4. The structure of claim 1 wherein:
   the second via chain and the first via chain are electrically connected in series;
   the first constant current is the second constant current;
   the voltage sensing apparatus includes a first force connection and a second force connection configured to drive the second constant current through the second via chain and the first via chain;
   the voltage sensing apparatus includes a first sense connection, a second sense connection, and a third sense connection;
   the voltage sensing apparatus is configured to measure a second voltage drop across the second via chain with the first sense connection and the second sense connection; and
   the voltage sensing apparatus is configured to measure a first voltage drop across the first via chain with the second sense connection and the third sense connection.

5. The structure of claim 1 wherein the first via chain comprises two first via chains and the second via chain comprises two second via chains, and wherein the structure further comprises an amplifier bridge including a first via chain—second via chain path and a second via chain—first via chain path formed from the first via chains and the second via chains, wherein the voltage sensing apparatus includes a first force connection and a second force connection configured to drive a constant current through the amplifier bridge, and a first voltage sense connection and a second sense connection configured to measure the differential voltage between the first via chain of the first via chain—second via chain path and the second via chain of the second via chain—first via chain path.

6. The structure of claim 1 wherein:
   the first via chain and the second via chain each extend in a longitudinal direction; and
   the vias in each via region are arranged in a linear layout substantially perpendicular to the longitudinal direction.

7. The structure of claim 1 wherein:
   the first via chain and the second via chain each extend in a longitudinal direction;
   a selected via region Z in the first via chain includes two vias and the corresponding selected via region Z in the second via chain includes three vias;
   the two vias in the selected via region Z in the first via chain are arranged in a first linear layout substantially perpendicular to the longitudinal direction; and
   two outer vias in the selected via region Z in the second via chain are arranged in a second linear layout equivalent to the first liner layout and a third via is positioned between the two outer vias.

8. The structure of claim 1 wherein:
   the first via chain and the second via chain each extend in a longitudinal direction; and
   the vias in each via region are arranged in a linear layout substantially parallel or coincident with the longitudinal direction.

9. The structure of claim 1 wherein:
the first via chain and the second via chain each extend in a longitudinal direction;
a selected via region Z in the first via chain includes two vias and the corresponding selected via region Z in the second via chain includes three vias; and
the two vias in the selected via region Z in the first via chain are arranged in a first linear layout substantially parallel or coincident with the longitudinal direction; and
two outer vias in the selected via region Z in the second via chain are arranged in a second linear layout equivalent to the first liner layout and a third via is positioned between the two outer vias.

10. A structure for testing a via chain comprising:
a first via chain having N via regions, wherein each via region includes $M_N$ vias;
a second via chain having N via regions, wherein each via region includes $M_N+K_N$ vias and wherein:
$K_N \geq 2$ for at least two via regions when $M_N=1$;
$K_N \geq 1$ for at least three via regions when $M_N=1$; or
$K_N \geq 1$ for at least seven via regions when $M_N=2$; and
a voltage sensing apparatus in electrical connection with each via chain and configured to drive a first constant current through the first via chain and to drive a second constant current through the second via chain to measure a differential voltage between the first via chain and the second via chain.

11. The structure of claim 10 further comprising a controller configured to calculate a resistance of the vias in the first via chain from the differential voltage.

12. The structure of claim 10 wherein the voltage sensing apparatus comprises a first four-terminal sensing apparatus connected to the first via chain and configured to drive the first constant current through the first via chain to measure a first voltage drop across the first via chain and a second four-terminal sensing apparatus connected to the second via chain and configured to drive the second constant current through the second via chain to measure a second voltage drop across the second via chain.

13. The structure of claim 10 wherein:
the second via chain and the first via chain are electrically connected in series;
the first constant current is the second constant current;
the voltage sensing apparatus includes a first force connection and a second force connection configured to drive the second constant current through the second via chain and the first via chain;
the voltage sensing apparatus includes a first voltage sense connection, a second sense connection, and a third sense connection;
the voltage sensing apparatus is configured to measure a second voltage drop across the second via chain with the first sense connection and the second sense connection; and
the voltage sensing apparatus is configured to measure a first voltage drop across the first via chain with the second sense connection and the third sense connection.

14. The structure of claim 10 wherein the first via chain comprises two first via chains and the second via chain comprises two second via chains, and wherein the structure further comprises an amplifier bridge including a first via chain—second via chain path and a second via chain—first via chain path formed from the first via chains and the second via chains, wherein the voltage sensing apparatus includes a first force connection and a second force connection configured to drive a constant current through the amplifier bridge, and a first voltage sense connection and a second sense connection configured to measure the differential voltage between the first via chain of the first via chain—second via chain path and the second via chain of the second via chain—first via chain path.

15. The structure of claim 10 wherein:
the first via chain and the second via chain each extend in a longitudinal direction; and
the vias in each via region are arranged in a linear layout substantially perpendicular to the longitudinal direction.

16. The structure of claim 10 wherein:
the first via chain and the second via chain each extend in a longitudinal direction;
for corresponding selected via regions Z in the first via chain and the second via chain $M_Z=2$ and $K_Z=1$;
the two vias in the selected via region Z in the first via chain are arranged in a first linear layout substantially perpendicular to the longitudinal direction; and
two outer vias in the selected via region Z in the second via chain are arranged in a second linear layout equivalent to the first liner layout and a third via is positioned between the two outer vias.

17. The structure of claim 10 wherein:
the first via chain and the second via chain each extend in a longitudinal direction; and
the vias in each via region are arranged in a linear layout substantially parallel or coincident with the longitudinal direction.

18. The structure of claim 10 wherein:
the first via chain and the second via chain each extend in a longitudinal direction;
for corresponding selected via regions Z in the first via chain and the second via chain $M_Z=2$ and $K_Z=1$;
the two vias in the selected via region Z in the first via chain are arranged in a first linear layout substantially parallel or coincident with the longitudinal direction; and
two outer vias in the selected via region Z in the second via chain are arranged in a second linear layout equivalent to the first liner layout and a third via is positioned between the two outer vias.

19. A method for testing an integrated circuit, the method comprising:
providing a semiconductor substrate disposed with a first via chain and a second via chain, wherein the first via chain includes a first sequence of segments interconnected at N via regions by a first via arrangement, wherein the first via arrangement includes a selected number of first vias at each respective via region in the first via chain, wherein the second via chain includes a second sequence of segments interconnected at N via regions by a second via arrangement different from the first via arrangement, wherein the second via arrangement includes a selected number of second vias at each respective via region in the second via chain, and wherein the second sequence of segments is substantially the same as the first sequence of segments;
driving a first constant current through the first via chain;
driving a second constant current through the second via chain, wherein the second constant current is equal to the first constant current; and
calculating a resistance of the first vias in the first via chain.

20. The method of claim 19 wherein calculating a resistance of the first vias in the first via chain comprises:
calculating a first resistance in the first via chain;
calculating a second resistance in the second via chain; and subtracting the second resistance from the first resistance to calculate the resistance of the first vias in the first via chain.

\* \* \* \* \*